(12) United States Patent
Cho

(10) Patent No.: US 6,891,341 B2
(45) Date of Patent: May 10, 2005

(54) ALIGNING APPARATUS IN SEMICONDUCTOR DEVICE TEST HANDLER

(75) Inventor: Jae Hyuk Cho, Kyonggi-do (KR)

(73) Assignee: Mirae Corporation, Choongchungnam-do (KR)

(*) Notice: Subject to any disclaimer, the term of this patent is extended or adjusted under 35 U.S.C. 154(b) by 106 days.

(21) Appl. No.: 10/314,388

(22) Filed: Dec. 9, 2002

(65) Prior Publication Data

US 2003/0111970 A1 Jun. 19, 2003

(30) Foreign Application Priority Data

Dec. 17, 2001 (KR) .................. 10-2001-0080152

(51) Int. Cl.[7] .................. H02P 5/46; G05B 11/32; B25B 1/20; B65G 49/07
(52) U.S. Cl. .................. 318/34; 318/625; 269/37; 269/43; 414/331.14; 414/935
(58) Field of Search .................. 414/331.14, 749.6, 414/935–41; 29/739–741; 269/42, 43, 45, 56, 60; 318/625, 628, 687, 649, 67, 135; 355/52, 53, 72, 74, 75; 310/10, 12

(56) References Cited

U.S. PATENT DOCUMENTS

| | | | | |
|---|---|---|---|---|
| 4,924,258 A | * | 5/1990 | Tsutsui | 355/53 |
| 5,022,619 A | * | 6/1991 | Mamada | 248/187.1 |
| 5,537,186 A | * | 7/1996 | Korenaga et al. | 355/53 |
| 5,744,924 A | * | 4/1998 | Lee | 318/568.17 |
| 5,969,441 A | * | 10/1999 | Loopstra et al. | 310/12 |
| 6,002,465 A | * | 12/1999 | Korenaga | 355/53 |
| 6,260,282 B1 | * | 7/2001 | Yuan et al. | 33/1 M |
| 6,271,640 B1 | * | 8/2001 | Lee | 318/560 |
| 6,327,022 B1 | * | 12/2001 | Nishi | 355/53 |
| 6,498,350 B2 | * | 12/2002 | Kwan et al. | 250/442.11 |
| 6,550,133 B1 | * | 4/2003 | Seo et al. | 29/741 |
| 6,594,887 B1 | * | 7/2003 | Okuda et al. | 29/739 |
| 6,603,531 B1 | * | 8/2003 | Binnard | 355/53 |
| 6,639,654 B2 | * | 10/2003 | Binnard et al. | 355/72 |
| 6,665,054 B2 | * | 12/2003 | Inoue | 355/77 |
| 6,703,259 B2 | * | 3/2004 | Bayot | 438/106 |
| 6,721,041 B2 | * | 4/2004 | Tanaka | 355/72 |
| 6,724,466 B2 | * | 4/2004 | Ono et al. | 355/72 |
| 2001/0015795 A1 | * | 8/2001 | Nishi | 355/53 |
| 2002/0075469 A1 | * | 6/2002 | Tanaka | 355/72 |
| 2002/0196421 A1 | * | 12/2002 | Tanaka et al. | 355/72 |
| 2003/0030402 A1 | * | 2/2003 | Binnard | 318/649 |
| 2004/0012768 A1 | * | 1/2004 | Tanaka et al. | 355/72 |
| 2004/0051402 A1 | * | 3/2004 | Hazelton et al. | 310/12 |
| 2004/0051854 A1 | * | 3/2004 | Tanaka et al. | 355/53 |
| 2004/0201834 A1 | * | 10/2004 | Uchida | 355/72 |

FOREIGN PATENT DOCUMENTS

TW 496530 7/2002

* cited by examiner

Primary Examiner—David Martin
Assistant Examiner—Patrick Miller
(74) Attorney, Agent, or Firm—Fleshner & Kim, LLP

(57) ABSTRACT

An aligning apparatus for a semiconductor device test handler is provided which reduces semiconductor device loading and unloading time. An exchange unit of the handler includes a pair of aligners which operate independently to continuously transfer devices to a test site of the handler for test, and then away from the handler upon completion of the test. Both horizontal and vertical movement of each of the aligners facilitates the loading and unloading of semiconductor devices. This aligning apparatus provides for simplified design and operation of the aligners, and improves loading and unloading speed, thereby enhancing test efficiency.

24 Claims, 6 Drawing Sheets

ALIGNING APPARATUS IN SEMICONDUCTOR DEVICE TEST HANDLER

This application claims the benefit of the Korean Application No. P2001-80152 filed on Dec. 17, 2001, which is hereby incorporated by reference.

BACKGROUND OF THE INVENTION

1. Field of the Invention

The present invention relates to an aligning apparatus for receiving to align semiconductor devices with a predetermined interval from each other in a semiconductor device test handler, and more particularly, to an aligning apparatus in a semiconductor device test handler aligning semiconductor devices to leave a predetermined interval from each other before the semiconductors to be tested in the handler are reloaded on a test tray or when the tested semiconductors are unloaded from the test tray.

2. Discussion of the Related Art

Generally, devices such as memory semiconductor devices, n-memory semiconductor devices, and the like and modules having such devices arranged on a single substrate to construct circuits are inspected by various tests for shipment. A handler is an apparatus used for testing the devices, the module RAMs, and the like automatically.

Most of the handlers carry out not only general performance tests at room temperature but also high and low temperature tests to check whether the devices, the module RAMs, or the like operate normally by building up environments at extremely high or low temperature through an electric heater or a liquefied nitrogen jetting system in an airtight chamber.

FIG. 1 illustrates a diagram of a handler for testing semiconductor devices.

Referring to FIG. 1, a loading stacker 10, on which user trays receiving a plurality of semiconductor devices to be tested are loaded, is installed in a front part of the handler. And, an unloading stacker 20 is installed at one side of the loading stacker 10 so that the tested semiconductor devices are classified by test results to be received in the user trays.

Buffer units 40, on which the semiconductor devices transferred from the loading stacker 10 are temporarily loaded, are installed to move back and forth at both sides of a middle part of the handler. And, an exchange unit 50 is installed between the buffer units 40. In the exchange unit 50, carried out are a process of transferring to reload the test-expecting semiconductor devices of the buffer unit 40 on test trays T and another process of loading the tested semiconductor devices of the test trays on the buffer units 40.

Between the handler front part, on which the loading and unloading stackers 10 and 20 are arranged, and the handler middle part, on which the exchange and buffer units 50 and 40 are arranged, first and second pickers 31 and 32 moving linearly along an X-Y axis to pick up to transport the semiconductor devices are installed. The first picker 31 moves between the loading/unloading stackers 10/20 and the buffer units 40 to pick up to transport the semiconductor devices, and the second picker 32 moves between the buffer units 40 and the exchange unit 50 to pick up to transport the semiconductor devices.

In a rear part of the handler, installed is a test site 70 for testing a semiconductor device performance at a predetermined temperature by conveying the test trays T having the semiconductor devices loaded thereon sequentially after high or low temperature test environments have been built in a plurality of separate airtight chambers divided into a preheating chamber 71, a test chamber 72, and a defrosting chamber 73.

Meanwhile, in the exchange unit 50, although not shown in the drawing, installed are a pair of aligners each of which has device landing recesses having the same pitch of a device loading carrier of the test tray T, a lower pushing unit loading the semiconductor devices on the test tray in horizontal level by the operations of absorbing the semiconductor devices by suction through passing holes of the device landing recesses of each of the aligners and lifting each of the aligners through several steps, and an upper pushing unit separating the semiconductor devices from the test tray by pushing the semiconductor devices from an upper side of the test tray to load the semiconductor devices on the aligners.

However, since each of the aligners in the handler according to the related art is coupled with the lower pushing unit in one body to move back and forth to carry out its function, it takes quite a long time to move to load the aligned semiconductor toward the test tray. Hence, an overall test time increases.

SUMMARY OF THE INVENTION

Accordingly, the present invention is directed to an aligning apparatus in a semiconductor device test handler that substantially obviates one or more problems due to limitations and disadvantages of the related art.

An object of the present invention is to provide an aligning apparatus in a semiconductor device test handler enabling to reduce a time taken for loading semiconductor devices on a test tray by means of an aligner and a lower pushing unit which are driven to operate independently to align the semiconductor devices.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an aligning apparatus in a semiconductor device handler according to the present invention includes first and second guide members installed in parallel at a handler body to confront each other, third and fourth guide members installed in parallel with and under the first and second guide members, respectively, a first aligner having both ends coupled with the first and second guide members respectively to move along the first and second guide members wherein a plurality of device landing recesses are arranged on the first aligner to leave a predetermined interval from each other, a second aligner having both ends coupled with the third and fourth guide members respectively to be installed in a level lower than that of the first aligner wherein a plurality of device landing recesses are arranged on the second aligner to leave a predetermined interval from each other, a first driving means for driving the first aligner along the first and second guide members, and a second driving means for driving the second aligner along the third and fourth guide members separately from the first aligner.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
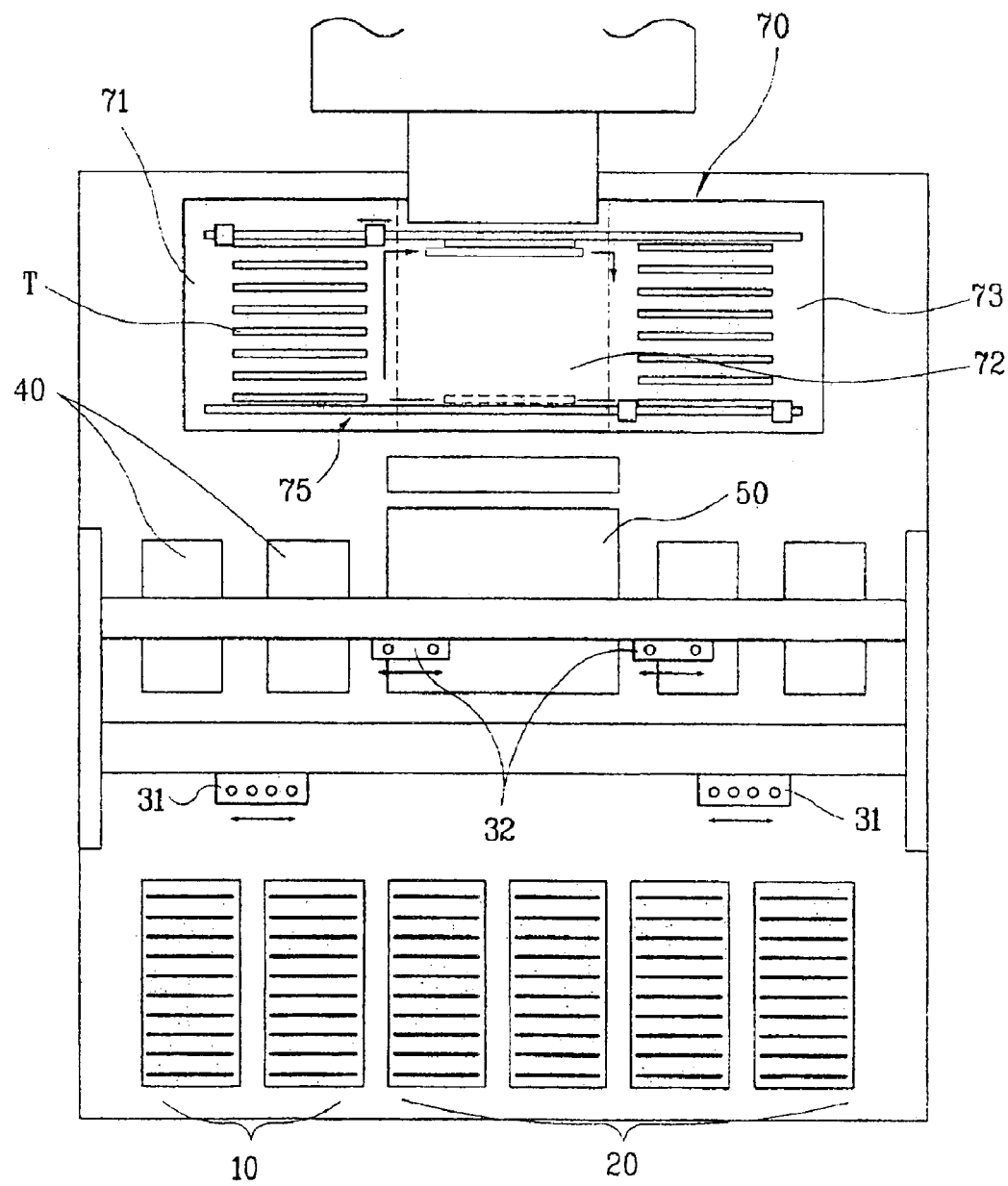
FIG. 1 illustrates a schematic layout of a general handler.
Figure 2:
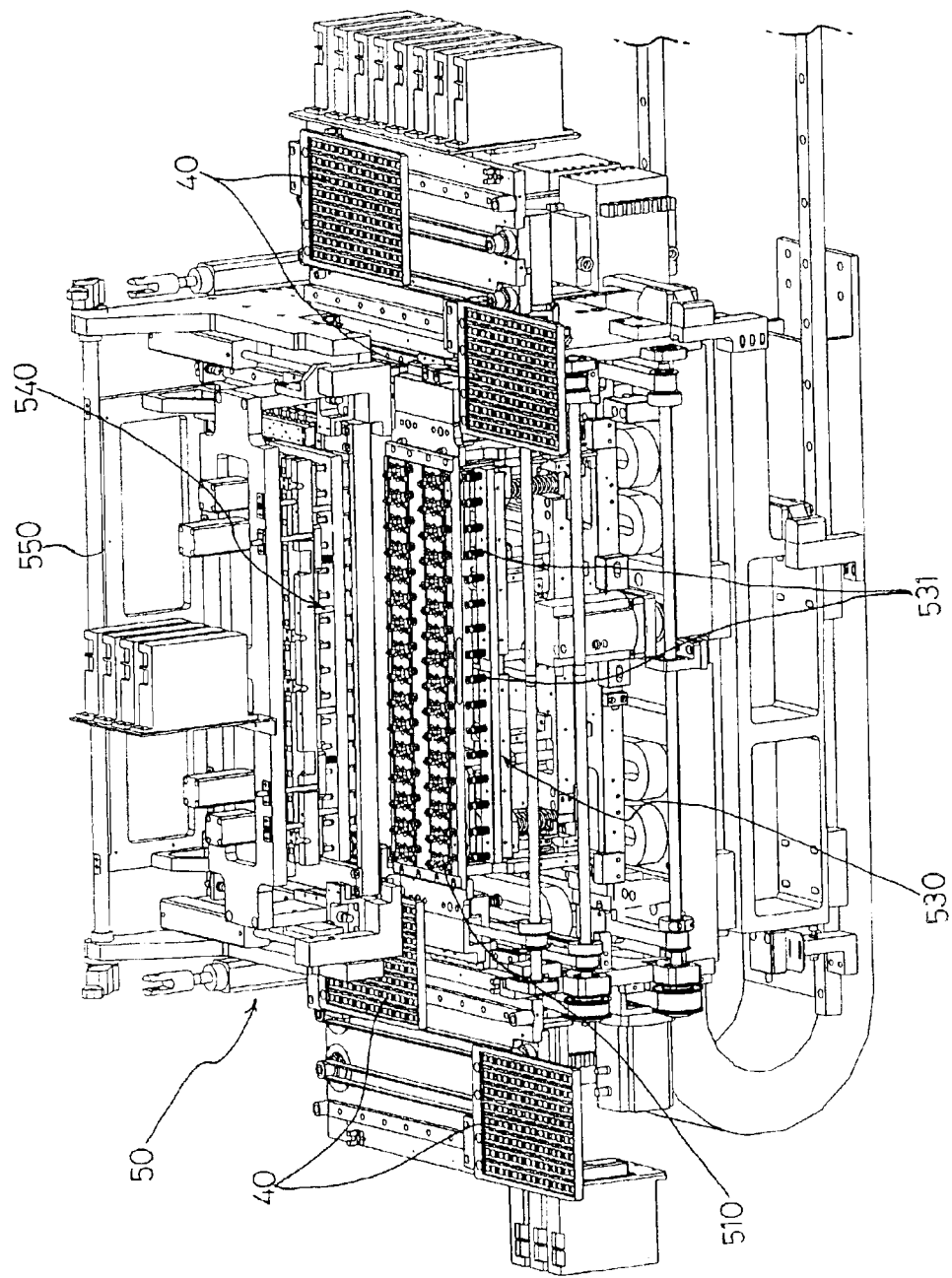
FIG. 2 illustrates a bird's-eye view of a handler exchange unit having an aligning apparatus installed thereof according to the present invention.
Figure 3:
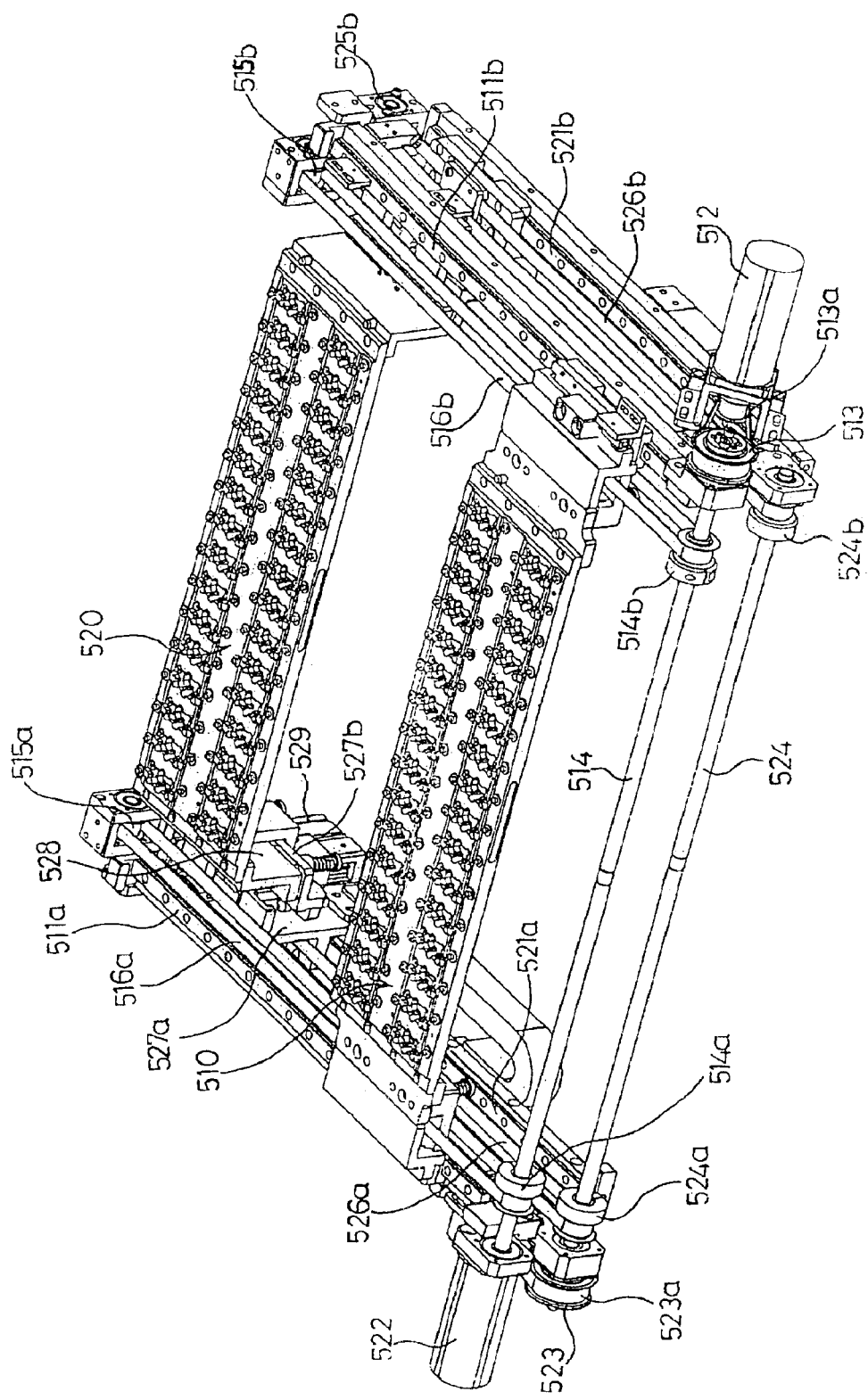
FIG. 3 illustrates a bird's-eye view of an aligning apparatus according to the present invention.
Figure 4:
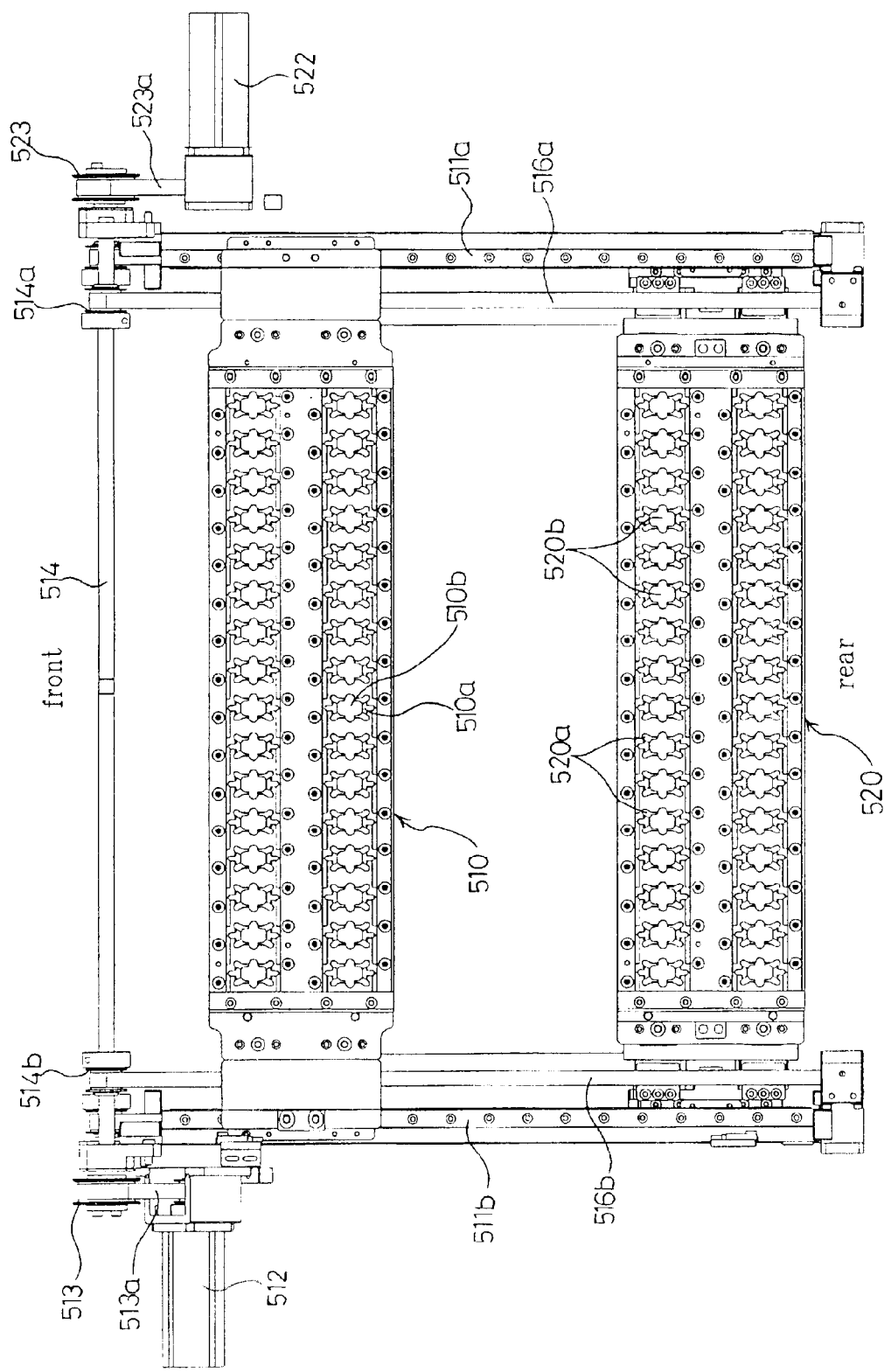
FIG. 4 illustrates a layout of the aligning apparatus in FIG. 3 according to the present invention.
Figure 5:
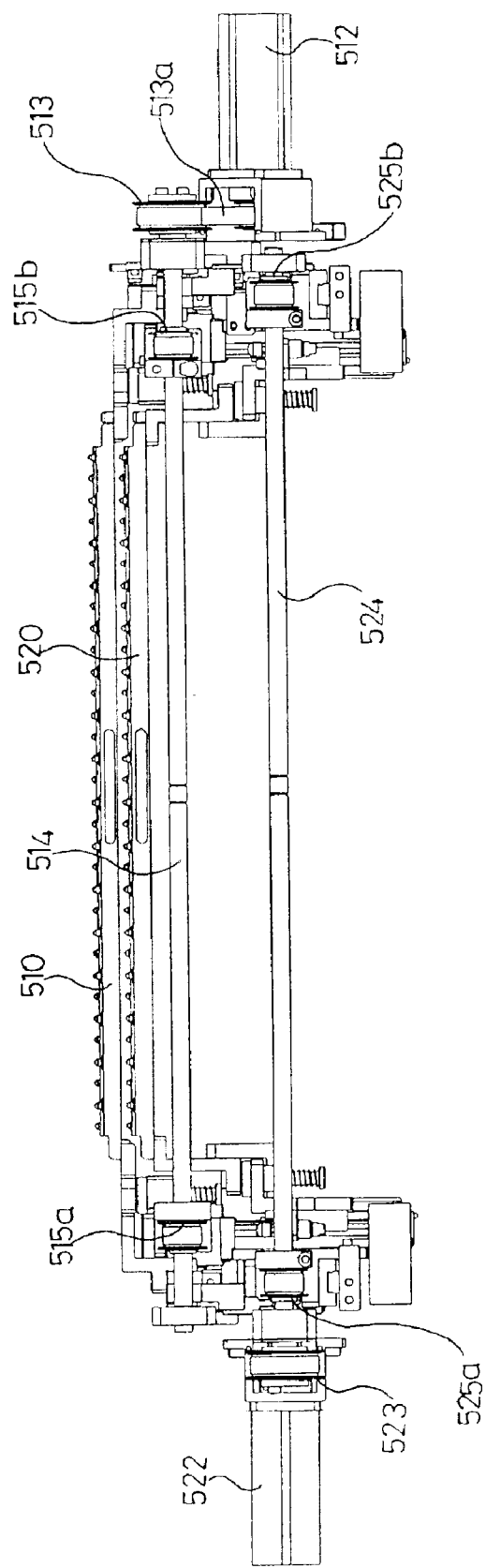
FIG. 5 illustrates a front view of the aligning apparatus in FIG. 3 according to the present invention.
Figure 6:
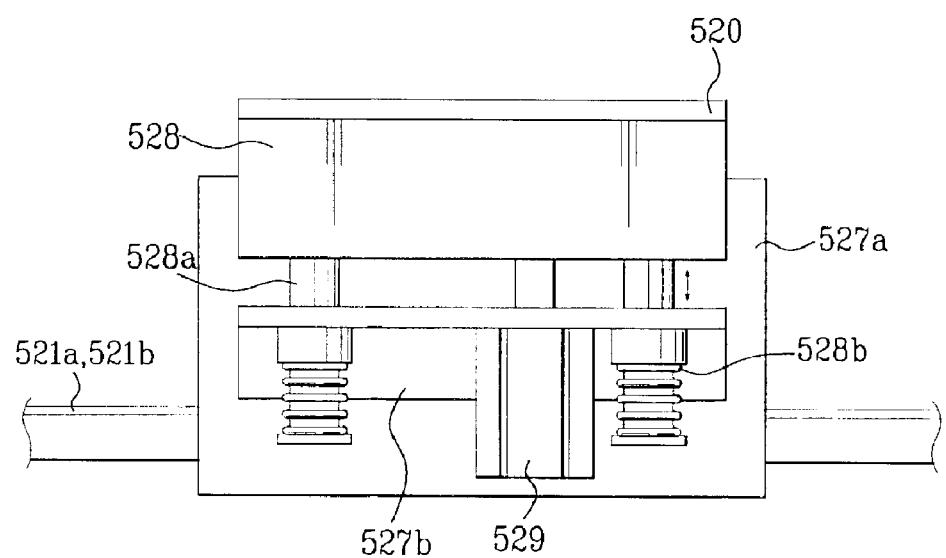
FIG. 6 illustrates a front view of a partial structure for lifting a second aligner of the aligning apparatus in FIG. 3.

FIG. 2 illustrates a bird's-eye view of a handler exchange unit (cf. FIG. 1) having an aligning apparatus installed therein according to the present invention.

Referring to FIG. 2, an exchange unit 50 includes first and second aligners 510 and 520 on which semiconductor devices transferred from buffer units 40 at both sides by a second picker 32 are mounted and aligned, a lower pushing unit 530 installed under the first and second aligners 510 and 520 to move back and forth to load the semiconductor devices on each device loading carrier(riot shown in the drawing) of a test tray T in horizontal level by lifting the first and second aligners 510 and 520 in a rear location for loading the semiconductor devices on the test tray T, an upper pushing unit 540 installed over the test tray T to move upward/downward and back/forth to provide a state enabling to load or unload the semiconductor devices on/from the test tray T by pushing a device fixing latch (not shown in the drawing) of each of the device loading carriers (not shown in the drawing) of the test array T, and a rotator 550 installed in a last rear side of the exchange unit 50 to turn at 90° to make the test tray T, which is held in horizontal level, stand upright and transfer the test tray T between the exchange unit 50 and a test site 70.

FIGS. 3 to 6 illustrate the constitution of the aligning apparatus in FIG. 2 according to the present invention Referring to FIGS. 3 to 6, a pair of first and second guide members 511a and 511b such as LM guides are installed at a body of a handler in parallel to confront each other in front/rear directions. And, third and fourth guide members 521a and 521b are installed under the first and second guide members 511a and 511b to be in parallel with the first and second guide members 511a and 511b, respectively.

The first and second guide members 511a and 511b are coupled with both ends of the first aligner 510 on which the semiconductors are mounted and aligned, respectively, and the first aligner 510 moves along the firs and second guide members 511a and 511b in the front/rear directions of the handler.

Moreover, movable blocks 527a are coupled with the third and fourth guide members 521a and 521b to move along the third and fourth guide members 521a and 521b, respectively. A support block 527b is fixed horizontally to an inner side of the movable block 527a. An elevating block 528 is coupled with the support block 527b to move upward and downward to a predetermined distance through a guide shaft 528a. And, one end of the second aligner 520 is coupled with an upper end of the elevating block 528. The elevating block 528 moves upward and downward by the operation of a cylinder 529 fixed to the movable block 527a. A reference numeral '528b' indicates a compression spring supporting the guide shaft 528a elastically against the support block 527b.

Hence, as the movable blocks 527a move along the third and fourth guide members 521a and 521b, the second aligner 520 moves horizontally in the front/rear directions of the handler as well as moves upward and downward by the operation of the cylinders 529 to a predetermined height at a predetermined location.

Meanwhile, in order to prevent the first and second aligners 510 and 520 from being interfered with each other when first and second aligners 510 and 520 are moving to operate independently, the first aligner 510 is installed at a position higher than that of the second aligner 520. The second aligner 520 is made to move upward at the front or rear end part of the exchange unit 50 for exchanging the semiconductor devices by the operation of the cylinders 529 to be at the same level of the first aligner 510.

A plurality of landing grooves 510a and 520a at which the semiconductor devices land are formed on the first and second aligners 520, respectively to have the same pitch of the device loading carrier(not shown in the drawing) of the test tray T. And, passing holes 510b and 520b are formed in the landing recesses 510a and 520a respectively so that the lower pushing unit 530 enables to hold the semiconductor devices.

A first servomotor 512 is installed at the front part of the handler body having the second guide member 511b. The first servomotor 512 is coupled with a pulley 513 through a belt 513a to turn the pulley 513. And, the pulley 513 is coupled with a first driving shaft 514 installed to turn across front ends of the first and second guide members 511a and 511b so as to revolve the first driving shaft 514. Namely, once the first servomotor 512 operates, a driving force is transferred to the pulley 513 through the belt 513a to turn the first driving shaft 514.

A pair of driving pulleys 514a and 514b are built in one body with the first driving shaft 514. And, a pair of driven pulleys 515a and 515b are installed at one sides of rear ends of the first and second guide members 511a and 511b, respectively. The driven pulleys 515a and 515b are coupled with the driving pulleys 514a and 514b through belts 516a and 516b, respectively to revolve. And, the belts 516a and 516b are coupled with both ends of the first aligner 510, respectively.

Hence, once the driving pulleys 514a and 514b starts to turn by the revolution of the first driving shaft 514, the belts 516a and 516b are driven to move the first aligner 510 back and forth.

Meanwhile, a means for driving the second aligner back and forth has the same constitution of the above-explained means.

A second servomotor 522 is installed at one side of the third guide member 521a. The second servomotor 522 is coupled with a pulley 523 through a belt 523a to turn the pulley 523. And, the pulley 523 is coupled with a second driving shaft 524 installed to turn across front ends of the third and fourth guide members 521a and 521b so as to revolve the second driving shaft 524. Namely, once the second servomotor 522 operates, a driving force is transferred to the pulley 523 through the belt 523a to turn the second driving shaft 524.

A pair of driving pulleys 524a and 524b are built in one body with the second driving shaft 524. And, a pair of driven pulleys 525a and 525b are installed at one sides of rear ends of the third and fourth guide members 521a and 521b, respectively. The driven pulleys 525a and 525b are coupled with the driving pulleys 524a and 524b through belts 526a and 526b, respectively to revolve. And, the belts 526a and 526b are coupled with both ends of the second aligner 520, respectively.

Operation of the above-constituted apparatus for aligning the semiconductor devices is explained as follows.

Once the first picker (cf. FIG. 1) of the handler picks up to transfer the test-expecting semiconductor devices to the buffer unit 40 from the loading stacker 10, the second picker 32 picks up to mount the semiconductor devices on the buffer unit 40 on the respective landing recesses 510a of the first aligner 510. In this case, the first aligner 510 is disposed at the maximum front side of the first and second guide members 511a and 51b.

Once the semiconductor devices land at the entire landing recesses 510a on the first aligner 510, the first servomotor 512 operates to turn the first driving shaft 514 so that the first aligner 510 moves backward along the first and second guide members 511a and 511b to be positioned right below the test tray T supported in horizontal level by the rotator 550. In this case, the lower pushing unit 530 is disposed right below the first aligner 510.

Subsequently, the lower pushing unit 530 operates to be lifted. And, sucking nozzles 531 of the lower pushing unit 530 hold the semiconductor devices through the passing holes 510b of each of the landing recesses 510a of the first aligner 510 to load them on each of the device loading carriers (not shown in the drawing) of the test tray T. The lower pushing unit 530 then moves downward.

Meanwhile, when the first aligner 510 having the semiconductor devices loaded thereon moves backward, the second aligner 520 is disposed at the maximum front end of the third and fourth guide members 521a and 521b by the movement of the movable blocks 528a. And, the second aligner 520 is lifted up to the same level of the first aligner 510 by the operation of the cylinders 529. The second aligner 520 then loads the test-expecting semiconductor devices on the landing recesses 520a of the second aligner 520 respectively by the operation of the second picker 32 like the semiconductor device loading work of the first aligner 510.

After the semiconductor devices have landed at the entire landing recesses 520a on the second aligner 520, the second aligner 520 moves downward by the operation of the cylinders 529 to return to its original position. Subsequently, the second aligner 520 moves to the rear side where the test tray T is disposed, and then is lifted up by the operation of the cylinders 529. After the semiconductor devices in the second aligner 520 have been loaded on the test tray T by the operation of the lower pushing unit 530, the second aligner 520 descends to return to its original location.

After all of the semiconductor devices have been loaded on the test tray T through the above-explained operations, the rotator 550 turns to make the test tray T stand upward to transfer the test tray to the test site 70 in the rear side. And, an additional tray conveyer 75 provided in the test site 70 transfers the test tray T to each chamber of the test site 70, whereby a predetermined test is carried out.

Meanwhile, when the test-expecting test tray T on the rotator 550 is removed from the test site 70, a tested test tray T is immediately transferred from a defrosting chamber 73 so that the rotator 550 holds the tested test tray T. The rotator 550 then turns reversely to be disposed in horizontal level with the exchange unit 50.

Subsequently, the upper pushing unit 540 is moved downward to separate to unload the tested semiconductor devices from the device loading carrier (not shown in the drawing) of the test tray T to the second and first aligners 520 and 510 in order. The second and first aligners 520 and 510 move to the front side in order by the operations of the second and first servomotors 522 and 512, respectively.

Finally, the second picker 32 picks up to transfer the tested semiconductor devices of the second and first aligners 520 and 510 so that the semiconductor devices are loaded on the buffer unit 40.

In such test procedures, the first and second aligners 510 and 520 repeat the above-explained operations to align to transfer the semiconductor devices to the front and rear parts of the exchange unit 50.

Accordingly, the aligners according to the present invention, on which the semiconductor devices are loaded for alignment, are driven independently to load/unload the semiconductor devices on/from the test tray, thereby reducing the test time as well as simplifying the constitution and operation of the aligners. Therefore, the present invention enables to improve the test efficiency.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An aligning apparatus in a semiconductor device handler, comprising:

first and second guide members installed parallel to each other on a handler body;

third and fourth guide members installed parallel to each other and under the first and second guide members, respectively;

a first aligner with a first end thereof coupled to the first guide member, and a second end thereof coupled to the second guide member so as to move along the first and second guide members, respectively, wherein a first plurality of device landing recesses are arranged at a first predetermined interval from each other on the first aligner;

a second aligner with a first end thereof coupled to the third guide member, and a second end thereof coupled to the fourth guide member so as to be installed at a level lower than that of the first aligner, wherein a second plurality of device landing recesses are arranged at a second predetermined interval from each other on the second aligner;

a first driving means for driving the first aligner along the first and second guide members; and a second driving means for driving the second aligner along the third and fourth guide members separately from the first aligner.

2. The aligning apparatus of claim 1, wherein the first driving means comprises:

a first driving motor installed at one side of the first or second guide member;

a first driving shaft installed so as to connect first ends of the first and second guide members and coupled with the first driving motor so as to revolve in response to a driving of the first driving motor;

a first pair of driving pulleys, wherein one of the first pair of driving pulleys is installed at each end of the first driving shaft;

a first pair of driven pulleys rotatably installed at second ends of the first and second guide members; and first and second driving belts each connecting respective first driving and first driven pulleys and each coupled with a respective end of the first aligner.

3. The aligning apparatus of claim 2, wherein the second driving means comprises:

a second driving motor installed at one side of the third or fourth guide member;

a second driving shaft installed so as to connect first ends of the third and fourth guide members and coupled with the second driving motor so as to revolve;

a pair of second driving pulleys, wherein one of the second pair of driving pulleys is installed at each of the second driving shaft;

a pair of second driven pulleys rotatably installed at second ends of the third and fourth guide members; and third and fourth driving belts each connecting respective second driving and second driven pulleys and each coupled to a respective end of the second aligner.

4. The aligning apparatus of claim 1, wherein the second driving means comprises:

a second driving motor installed at one side of the third or fourth guide member;

a second driving shaft installed so as to connect first ends of the third and fourth guide members and coupled with the second driving motor so as to revolve in response to a driving of the first driving motor;

a pair of second driving pulleys, wherein one of the second pair of driving pulleys is installed at each end of the second driving shaft;

a pair of second driven pulleys rotatably installed at second ends of the third and fourth guide members; and third and fourth driving belts each connecting respective second driving and second driven pulleys and each coupled to a respective end of the second aligner.

5. The aligning apparatus of claim 1, wherein the second aligner is configured to move upward and downward at front and rear ends of the third and fourth guide members so as to be disposed at the same level as the first aligner, and wherein an elevating means for elevating the second aligner to a predetermined level is installed under both ends of the second aligner.

6. The aligning apparatus of claim 5, wherein the elevating means comprises:

a pair of movable blocks coupled to the third and fourth guide members, wherein each of the pair of moveable blocks is configured to move along one of the third and fourth guide members, and wherein both of the ends of the second aligner are coupled to the movable blocks and configured to be elevated; and a pair of cylinders provided at both ends of the second aligner at one side of a respective movable block.

7. A semiconductor device handler comprising the aligning apparatus of claim 1.

8. An aligning apparatus for a semiconductor device handler, comprising:

a first guide member;

a second guide member positioned parallel to the first guide member;

a third guide member positioned beneath the first guide member;

a fourth guide member positioned beneath the second guide member and parallel to the third guide member;

a first aligner configured to be movably coupled to the first and second guide members;

a second aligner provided at a different level than that of the first aligner and configured to be movably coupled to the third and fourth guide members;

a first driver configured to drive the first aligner along the first and second guide members;

a second driver configured to drive the second aligner along the third and fourth guide members; and an elevating device configured to elevate the second aligner to a position level with the first aligner, and to return the second aligner to a position lower than the first aligner.

9. The aligning apparatus of claim 8, wherein the second driver is configured to drive the second aligner independent of the first aligner.

10. The apparatus of claim 8, wherein the first driver comprises:

a first driving motor provided proximate the first or second guide member;

a first driving shaft rotatably coupled to the first driving motor, wherein each end of the first driving shaft is configured to be coupled to a corresponding end of the first and second guide members;

a pair of first driving pulleys, wherein a first driving pulley is configured to be fixed to each end of the first driving shaft;

a pair of first driven pulleys, wherein a first driven pulley is configured to be rotatably installed at an end of each of the first and second guide members opposite the first driving shaft;

a pair of first driving belts, wherein each first driving belt is configured to connect a respective pair of first driving and first driven pulleys.

11. The apparatus of claim 10, wherein the second driver comprises:

a second driving motor provided proximate the third or fourth guide member;

a second driving shaft rotatably coupled to the second driving motor, wherein each end of the second driving shaft is configured to be coupled to a corresponding end of the third and fourth guide members;

a pair of second driving pulleys, wherein a second driving pulley is configured to be fixed to each end of the second driving shaft;

a pair of second driven pulleys, wherein a second driven pulley is configured to be rotatably installed at an end of each of the third and fourth guide members opposite the second driving shaft;

a pair of second driving belts, wherein each second driving belt is configured to connect a respective pair of second driving and second driven pulleys.

12. The apparatus of claim 8, wherein an end of the first aligner is configured to be movably coupled to the first guide member, and an opposite end of the first aligner is configured to be movably coupled to the second guide member.

13. The apparatus of claim 12, wherein an end of the second aligner is configured to be movably coupled to the third guide member, and an opposite end of the second aligner is configured to be movably coupled to the fourth guide member so as to position the second aligner at a lower level than the first aligner.

14. The apparatus of claim 8, wherein the elevating device is configured to elevate and to lower the second aligner when the second aligner is positioned at a front end portion and a rear end portion of the third and fourth guide members.

15. The apparatus of claim 14, wherein the elevating device comprises:
- a pair of moveable blocks configured to be moveably coupled to the third and fourth guide members, respectively, so as to move along a length of the third and fourth guide members;
- a pair of elevating blocks configured to be moveably coupled to the pair of moveable blocks, and to be elevated and lowered with respect to the pair of moveable blocks; and
- a pair of cylinders configured to elevate and lower the pair of elevating blocks.

16. The apparatus of claim 15, wherein opposite ends of the second aligner are configured to be fixed to a respective moveable block of the pair of moveable blocks so as to move along the third and fourth guide members.

17. The apparatus of claim 16, wherein opposite ends of the second aligner are configured to be fixed to a respective elevating block of the pair of elevating blocks so as to be elevated and lowered through the action of the pair of cylinders.

18. The apparatus of claim 8, wherein the first aligner comprises a first plurality of landing recesses configured to receive a corresponding plurality of semiconductor devices.

19. The apparatus of claim 18, wherein the first plurality of landing recesses are formed at a first predetermined interval from each other on the first aligner.

20. The apparatus of claim 18, wherein the second aligner comprises a second plurality of landing recesses configured to receive a corresponding plurality of semiconductor devices.

21. The apparatus of claim 20, wherein the second plurality of landing recesses are formed at a second predetermined interval from each other on the second aligner.

22. The apparatus of claim 21, further comprising a lower pushing unit positioned below the first and second aligners and configured to unload semiconductor devices from the first and second aligners through passing holes formed in the first and second plurality of landing recesses formed in the first and second aligners, respectively, and to load the semiconductor devices onto test trays for testing.

23. The apparatus of claim 22, further comprising an upper pushing unit positioned above the first and second aligners and configured to load tested semiconductor devices from the test trays onto the first and second aligners.

24. A semiconductor device handler comprising the apparatus of claim 8.

* * * * *